US010008991B2

(12) United States Patent
Isoyama

(10) Patent No.: US 10,008,991 B2
(45) Date of Patent: Jun. 26, 2018

(54) COMMUNICATION DEVICE

(71) Applicant: Kyocera Corporation, Kyoto (JP)

(72) Inventor: Shinji Isoyama, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 75 days.

(21) Appl. No.: 15/185,114

(22) Filed: Jun. 17, 2016

(65) Prior Publication Data
US 2016/0381686 A1 Dec. 29, 2016

(30) Foreign Application Priority Data

Jun. 25, 2015 (JP) .................................. 2015-127999

(51) Int. Cl.
H04W 72/04 (2009.01)
H03F 3/195 (2006.01)
H03F 3/24 (2006.01)
H04B 1/38 (2015.01)
(Continued)

(52) U.S. Cl.
CPC ............... H03F 3/195 (2013.01); H03F 1/30 (2013.01); H03F 3/245 (2013.01); H04B 1/38 (2013.01); H04L 5/001 (2013.01); H03F 2200/111 (2013.01); H03F 2200/171 (2013.01); H03F 2200/414 (2013.01); H03F 2200/447 (2013.01); H03F 2200/451 (2013.01); H03F 2200/468 (2013.01)

(58) Field of Classification Search
CPC .... H04W 72/0453; H04W 72/04; H04L 5/14; H03F 3/345; H03F 3/195; H03F 3/24
See application file for complete search history.

(56) References Cited

U.S. PATENT DOCUMENTS 8,755,757 B2 6/2014 Yamamoto
2001/0006891 A1* 7/2001 Cho ...................... H04W 24/00
455/425

(Continued)

FOREIGN PATENT DOCUMENTS

JP H06120737 A 4/1994
JP 2004-304435 A 10/2004
(Continued)

OTHER PUBLICATIONS

An Office Action; "Notice of Reasons for Rejection," mailed by the Japanese Patent Office dated May 9, 2017, which corresponds to Japanese Patent Application No. 2015-127999; with English language Concise Explanation.

Primary Examiner — Andrew Lee
(74) Attorney, Agent, or Firm — Studebaker & Brackett PC

(57) ABSTRACT

A communication device including a signal generator configured to generate a transmitting signal that uses a plurality of frequency bands, an amplifier configured to amplify and output the transmitting signal, a plurality of duplexers configured to separate and output a receiving signal and the transmitting signal, and a controller. The controller is configured to control power amplification of the transmitting signal by the amplifier based on the transmitting signal output from the duplexer, and control power amplification of the transmitting signal by the amplifier based on the transmitting signal input to the duplexer from the amplifier when a temperature is a predetermined value or more or the frequency of the transmitting signal is a predetermined value or more.

5 Claims, 8 Drawing Sheets

(51) Int. Cl.
*H04L 5/00* (2006.01)
*H03F 1/30* (2006.01)

(56) References Cited

U.S. PATENT DOCUMENTS

| | | | |
|---|---|---|---|
| 2002/0187766 A1* | 12/2002 | Shim | H03F 1/30 455/245.1 |
| 2004/0251975 A1* | 12/2004 | Li | H03B 27/00 331/46 |
| 2006/0199547 A1* | 9/2006 | Song | H04W 52/288 455/67.11 |
| 2007/0138614 A1* | 6/2007 | Harrison | H01L 23/3677 257/686 |
| 2008/0012611 A1* | 1/2008 | Sugimoto | G06F 1/04 327/117 |
| 2008/0268915 A1* | 10/2008 | Miyauchi | H04B 1/036 455/572 |
| 2012/0140852 A1* | 6/2012 | Kato | H03F 1/30 375/298 |
| 2012/0286867 A1 | 11/2012 | Yamamoto | |
| 2013/0176873 A1* | 7/2013 | Ji | H04W 52/0283 370/252 |
| 2014/0292403 A1* | 10/2014 | Liu | H03F 1/3241 330/149 |

FOREIGN PATENT DOCUMENTS

| | | |
|---|---|---|
| JP | 2009-182731 A | 8/2009 |
| JP | 2011-171840 A | 9/2011 |

\* cited by examiner

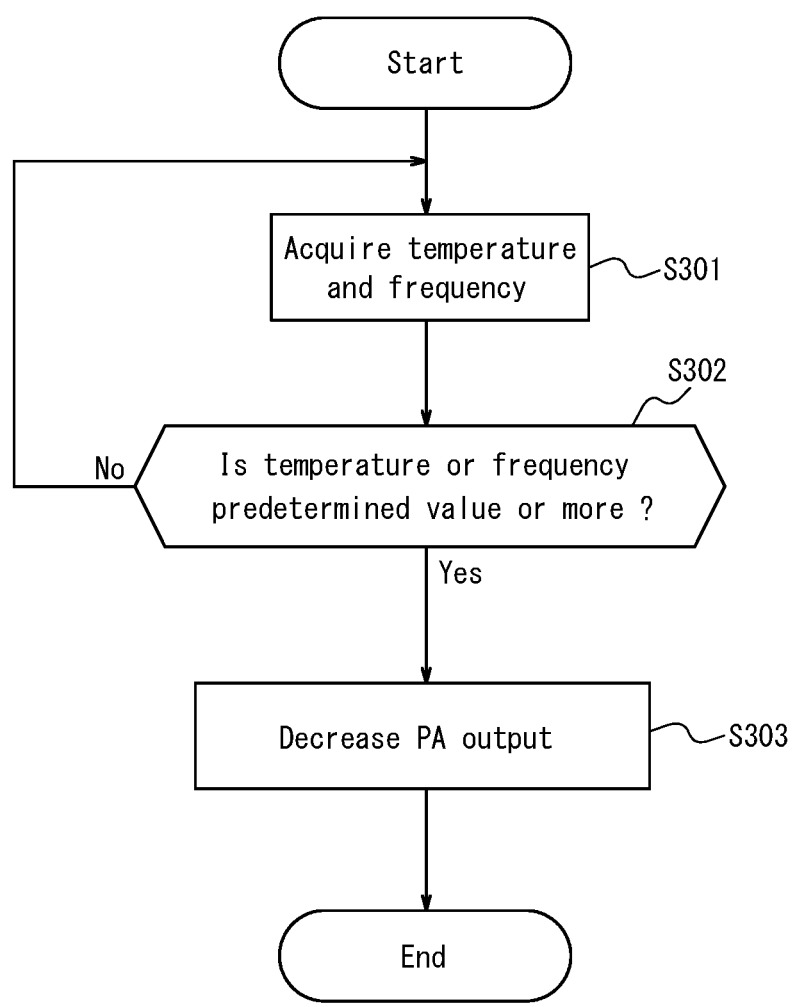

COMMUNICATION DEVICE

CROSS REFERENCE TO RELATED APPLICATION

This application claims priority to and the benefit of Japanese Patent Application No. 2015-127999 (filed on Jun. 25, 2015), the entire contents of which are incorporated herein by reference.

TECHNICAL FIELD

This disclosure relates generally to communication device, more particularly relates to a communication device capable of transmitting transmission signals by using a plurality of frequency bands.

BACKGROUND

In order to correspond to what is called a carrier aggregation that corresponds to a plurality of frequency bands and sends signals by using the a plurality of frequency bands simultaneously, a communication device in which a broadband coupler, a diplexer and a multiband switch (SW) are mounted between an antenna and a duplexer has been used.

In such a communication device, in order to keep the power of the output signal of the antenna to a predetermined value, a portion of the output signal is branched by a coupler and is detected, then the output of the amplifier is controlled based on the detection result.

SUMMARY

A communication device according to this disclosure includes:
  a signal generator configured to generate a transmitting signal that uses a plurality of frequency bands;
  an amplifier configured to amplify and output the transmitting signal generated by the signal generator;
  a plurality of duplexers configured to separate and output a receiving signal and the transmitting signal output by the amplifier;
  a first detection means configured to detect the transmitting signal output from the duplexer;
  a controller configured to control power amplification of the transmitting signal by the amplifier based on the detection by the first detection means; and
  a second detection means configured to detect the transmitting signal input to the duplexer from the amplifier,
  wherein the controller controls the power amplification of the transmitting signal by the amplifier based on the detection by the second detection means when a temperature is a predetermined value or more or a frequency of the transmitting signal is a predetermined value or more.

A communication device according to this disclosure includes:
  a signal generator configured to generate a transmitting signal that uses a plurality of frequency bands;
  an amplifier configured to amplify and output the transmitting signal generated by the signal generator;
  a plurality of duplexers configured to separate and output a receiving signal and the transmitting signal output by the amplifier;
  a first detection means configured to detect the transmitting signal output from the duplexer;
  a controller configured to control power amplification of the transmitting signal by the amplifier based on the detection by the first detection means, and decrease the power amplification of the transmitting signal by the amplifier when a temperature is a predetermined value or more or a frequency of the transmitting signal is a predetermined value or more.

BRIEF DESCRIPTION OF THE DRAWINGS

In the accompanying drawings:
FIG. 8 is a flow chart illustrating an operation example of the communication device according to the fourth embodiment of this disclosure.

DETAILED DESCRIPTION

The disclosed embodiments will be described in detail below with reference to the drawings.

In the above described conventional communication device, when a decrease in the power of the output signal is detected by wave detection, the power input to the duplexer is increased to increase the output of the amplifier. When the power input to the duplexer is increased, heat generation occurs due to the passing loss in the duplexer (hereinafter appropriately abbreviated as "self heat generation"). The duplexer has characteristics in which the passing properties shift to the low frequency side at a predetermined temperature or more, and the passing loss increases in particular at high frequencies. Therefore, there was a concern that, in the duplexer, if self heat generation continues with an increase in the input power, the passing loss would increase, and as a result, self heat generation would further continue.

It would therefore be helpful to provide a communication device that can prevent continuing self heat generation of a duplexer.

First Embodiment

Figure 1:
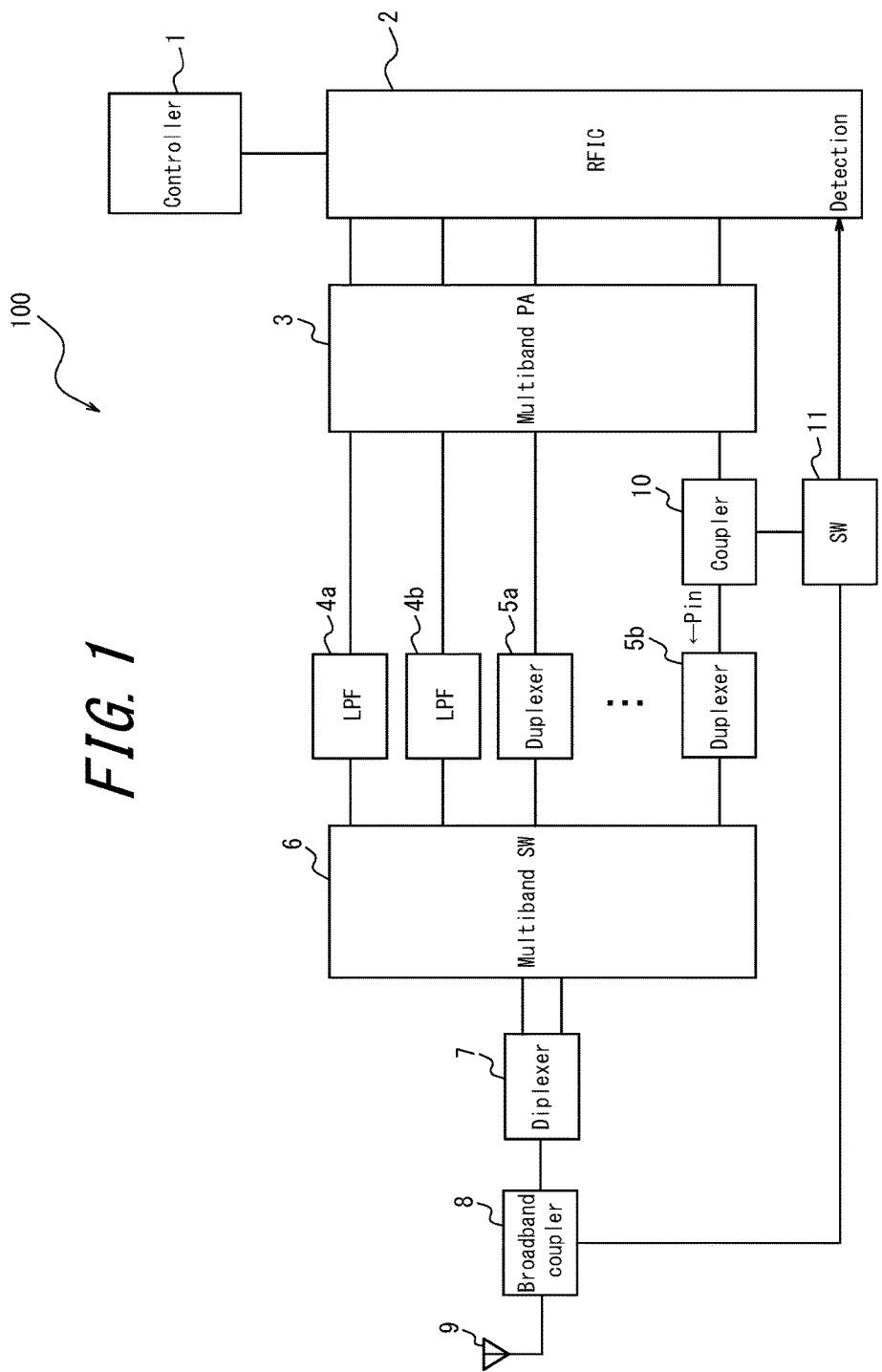
FIG. 1 is a schematic diagram illustrating a configuration of a communication device according to a first embodiment of this disclosure.

FIG. 1 is a schematic diagram illustrating a configuration of a communication device 100 according to the first embodiment of this disclosure. As illustrated in FIG. 1, a communication device 100 includes a controller 1, a radio frequency integrated circuit (RFIC) 2, a multiband power amplifier (PA) 3, low pass filters (LPF) 4a and 4b, duplexers 5a and 5b, a multiband switch (SW) 6, a diplexer 7, a broadband coupler 8 and an antenna (ANT) 9. The communication device 100 also includes a coupler 10 between the multiband PA 3 and the duplexer 5b and a switch (SW) 11 that can switch the connection between the broadband coupler 8 and RFIC 2 and the connection between the coupler 10 and RFIC 2.

It should be noted that, although two LPFs 4a and 4b and two duplexers 5a and 5b are indicated for convenience, any number of them can be disposed, respectively, and the number corresponds to the frequency band used by the communication device 100. Furthermore, in FIG. 1, the solid lines connecting functional blocks represent the wiring through which the power flows. Although there is a control signal or information flow between the controller 1 and many functional blocks, only the wiring with RFIC 2 is illustrated to facilitate visualization.

The controller 1 is configured, for example, by a microcomputer or the like that has a non-volatile memory and a processor that executes a control program stored in the memory, and controls operation of each portion. Specifically, the controller 1 stores the information associating the information of the detection signal from the broadband coupler 8 with the power of the transmitting signal on the position of the broadband coupler 8 and the information associating the information of the detection signal from the coupler 10 with the power of the transmitting signal on the position of the coupler 10. Then the controller 1 determines the power of the transmitting signal on the position of the broadband coupler 8 or the power of the transmitting signal on the position of the coupler 10 depending on the connection state of the switch 11 described below, based on the information on the detection signal input from RFIC 2, and controls the power amplification of the multiband PA3 so that the power of these transmitting signals is included in the preferable range.

Figure 3:
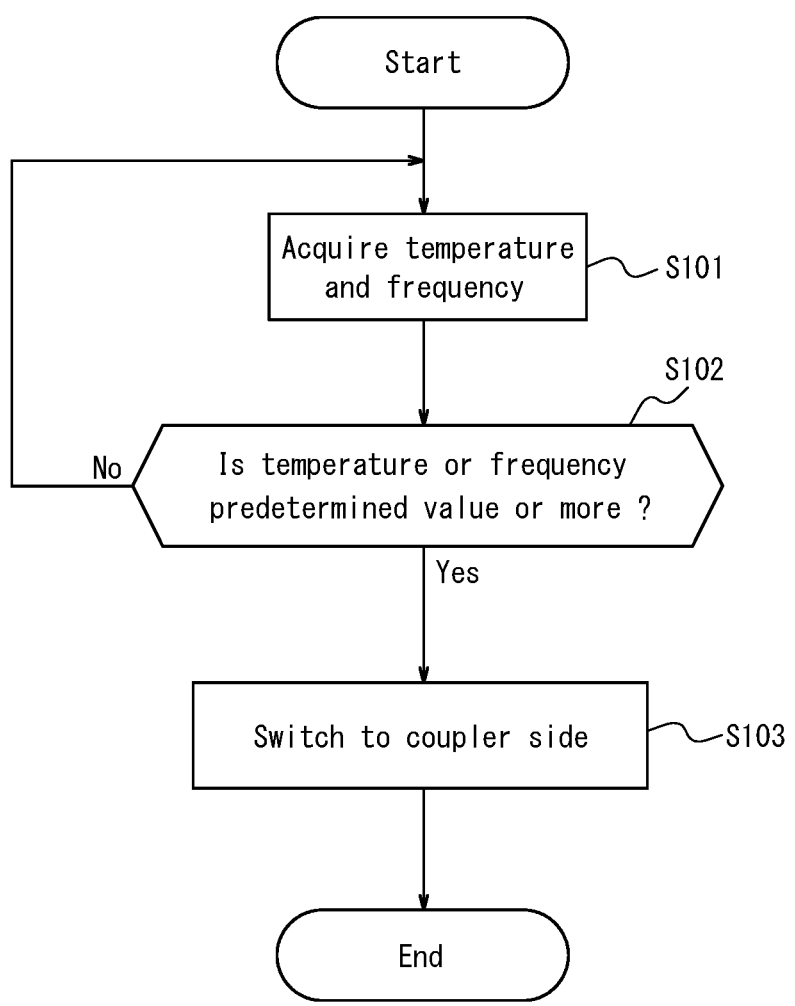
FIG. 3 is a flow chart illustrating an operation example of the communication device according to the first embodiment of this disclosure.

The controller 1 also stores a program that allows the communication device 100 to execute the operation illustrated in FIG. 3, which is described below, and the temperature threshold and the frequency threshold used for the processing of this program.

RFIC 2 is a signal generator that generates a transmitting signal such as a transmitting signal that uses a plurality of frequency bands according to a control signal from the controller 1. The transmitting signal generated by RFIC 2 is a signal of the communication standard, such as, for example, GSM (GSM is a registered trademark in Japan, other countries, or both) (Global System for Mobile communications), LTE (Long Term Evolution), UMTS (Universal Mobile Telecommunications System), or the like. RFIC 2 outputs the generated transmitting signals to the multiband PA 3 through a signal path that is chosen depending on the type and the working frequency band of the transmitting signal. Furthermore, when a detection signal is input from the broadband coupler 8 or the coupler 10, RFIC 2 outputs the information of the detection signal that has been input.

The multiband PA 3 amplifies the power of the transmitting signal input from RFIC 2 to a predetermined level and outputs the amplified transmitting signal to LPFs 4a and 4b or the duplexers 5a and 5b through a signal path that corresponds to the path for the signals to be input. For example, the multiband PA 3 outputs a transmitting signal of GSM standard or the like to LPFs 4a and 4b, and outputs a transmitting signal of LTE or UMTS standard or the like to the duplexers 5a and 5b. Furthermore, a temperature detection circuit is normally provided in the vicinity of the multiband PA 3, and the temperature detection circuit outputs the measurement temperature data to the controller 1. It should be noted that the temperature detection circuit is not necessarily provided in the vicinity of the multiband PA 3, and it is provided in the vicinity of the duplexer 5b to which the coupler 10 is connected.

LPFs 4a and 4b are filters that cut off the frequency component that is higher than a specific cutoff frequency from the transmitting signals of the GSM standard or the like that are input from the multiband PA 3 and output the resulting signals to the multiband SW 6.

The duplexers 5a and 5b are filters that are used to separate the transmitting signal and the receiving signal of the standard that adopts the FDD (Frequency Division Duplex) system such as LTE, UMTS, or the like, in which data transmission and reception are carried out simultaneously by using the frequency bands different from each other, and separate the transmitting signal input from the multiband PA 3 and the receiving signal input from the antenna 9. As a type of the duplexers 5a and 5b, a SAW (Surface Acoustic Wave) duplexer is commonly used. The number of duplexers in the communication device 100 depends on the working frequency band of the FDD system.

The multiband SW 6 is a switch that switches between LPFs 4a and 4b or duplexers 5a and 5b to be connected depending on the frequency band of the transmitting signal and the receiving signal to be input.

The diplexer 7 branches the receiving signal input from the antenna 9 into a high frequency band (e. g. 1 GHz or more) and a low frequency band (e. g. less than 1 GHz), and outputs the signal to the multiband SW 6. As the diplexer 7, a laminated type is used, for example.

The broadband coupler 8 is a coupler that operates in all frequency bands to which the communication device 100 corresponds, and outputs a portion (e.g. approx. $\frac{1}{10}$) of the transmitting signals input by the diplexer 7 to the switch 11 and the remaining signals to the antenna 9. The coupler also outputs all the receiving signals input from the antenna 9 to the diplexer 7.

The coupler 10 is connected between the multiband PA 3 and the duplexer 5b, and outputs a portion (e.g. approx. $\frac{1}{100}$) of the transmitting signals input from the multiband PA 3 to the switch 11 and the remaining signals to the duplexer 5b. It should be noted that the coupler 10 is connected to the duplexer that uses the frequency band that may cause the property deterioration due to self heat generation described below. Furthermore, a plurality of couplers 10 may be connected to a plurality of duplexers, respectively. The coupler 10 may also be built in the multiband PA 3.

According to the control signal from the controller 1, the switch 11 switches between the state where the broadband coupler 8 and RFIC 2 are connected (hereinafter appropriately referred to as "the first state") and the state where the coupler 10 and RFIC 2 are connected (hereinafter appropriately referred to as "the second state"). As a result of this, in the first state, the broadband coupler 8 functions as a first detection means that detects the power of the transmitting signal on the position of the broadband coupler 8, and in the second state, the coupler 10 functions as a second detection means that detects the power of the transmitting signal on the position of the coupler 10.

Figure 2:
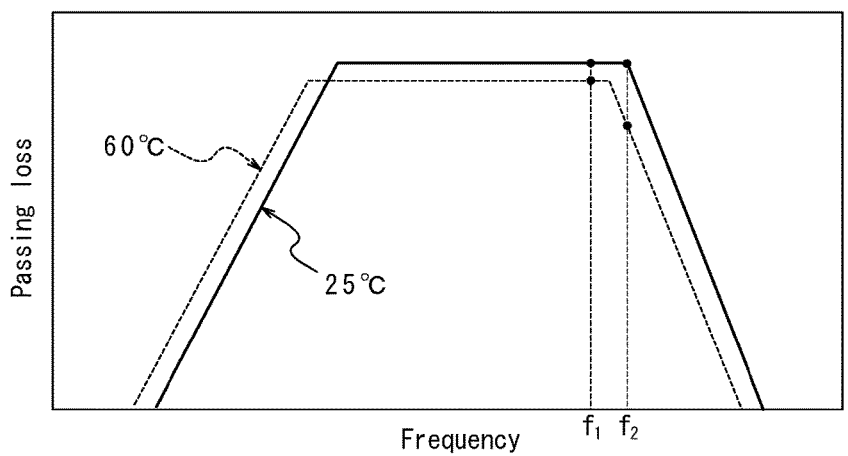
FIG. 2 is a conceptual diagram illustrating a frequency dependence of the passing properties of a duplexer.

Assuming that the switch 11 is in the first state all the time, the duplexer 5b may be damaged when the input power Pin increases. Its mechanism is described below. FIG. 2 is a conceptual diagram illustrating the frequency dependence of the passing properties of the duplexer 5b. Here, the horizontal axis is a frequency and indicates an increase in the frequency from the left to the right, and the vertical axis is a passing loss and indicates an increase in the passing loss from the upward to the downward.

For the duplexer 5b, the passing properties shift to the low frequency side as the temperature rises, and the passing loss increases in particular at high frequencies. For example, as illustrated in FIG. 2, at the frequency $f_2$, which is higher than the frequency $f_1$, there is a greater increase in the passing loss when the temperature increases from 25° C. to 60° C.

When Pin increases to be a predetermined value or more, heat generation occurs due to passing loss in the duplexer 5b (hereinafter approximately abbreviated as "self heat generation"). Since the passing properties of the duplexer 5b shifts to the low frequency side due to this self heat generation, the passing loss further increases and more self heat generation occurs. At the same time, the detected power decreases due to an increase in the passing loss, and thus the controller 1 increases the output power of the transmitting signal, and as a result of this, there is a further increase in Pin. Thus, in the duplexer 5b, self heat generation may continue to increase due to an increase in the passing loss.

In order to avoid the above described situation, the communication device 100 allows the controller 1 to execute the operation described below. FIG. 3 is a flow chart illustrating an operation example of the communication device 100 according to this embodiment. This operation example is executed while the communication device 100 outputs transmitting signals. Furthermore, during a normal operation, the switch 11 is connected to the first state, that is, to the broadband coupler 8.

First, the controller 1 acquires the information of the measured temperature by the temperature detection circuit and of the working frequency of a transmitting signal (step S101). Here, the information of the working frequency of the transmitting signal is the information of the working frequency of the transmitting signal that is generated and controlled by the controller 1 using RFIC 2 at the time when this step is executed.

Next, the controller 1 determines whether or not the temperature or the frequency acquired at step S101 is a predetermined value or more (step S102). Here, a predetermined value means a threshold of the temperature or a threshold of the frequency stored by the controller 1, and when the frequency is a predetermined value or more, it means that there is a frequency that is the threshold of the frequency or more in the working frequencies of the transmitting signal. It should be noted that the threshold of the temperature and that of the frequency stored by the controller 1 may be thresholds over which self heat generation of the duplexer 5b may continue when the switch 11 is in the first state all the time.

When the controller 1 determines that the temperature and the frequency are less than the predetermined value (No at step S102), the process returns to step S101. On the other hand, when the controller 1 determines that the temperature is the predetermined value or more or the frequency is the predetermined value or more (Yes at step S102), it switches the switch 11 to the second state, that is, to the coupler 10 side (step S103).

According to this embodiment, even if the temperature exceeds the predetermined value and the frequency exceeds the predetermined value, then as a result the passing loss of the duplexer 5b increases, when the switch 11 switches to the coupler 10 side, the power Pin that is input to the duplexer 5b is detected, and as a result, the detection result is not affected by the increase in the passing loss of the duplexer 5b. Thus, an increase in Pin can be prevented, and as a result, continuing self heat generation of the duplexer 5b can be prevented.

It should be noted that, at step S102, instead of determining whether or not the temperature is a predetermined value or more or the frequency is a predetermined value of more, whether or not the temperature is the predetermined value or more, whether or not the frequency is the predetermined value or more, or whether or not the temperature and the frequency are the predetermined values or more may be determined.

Second Embodiment

Figure 4:
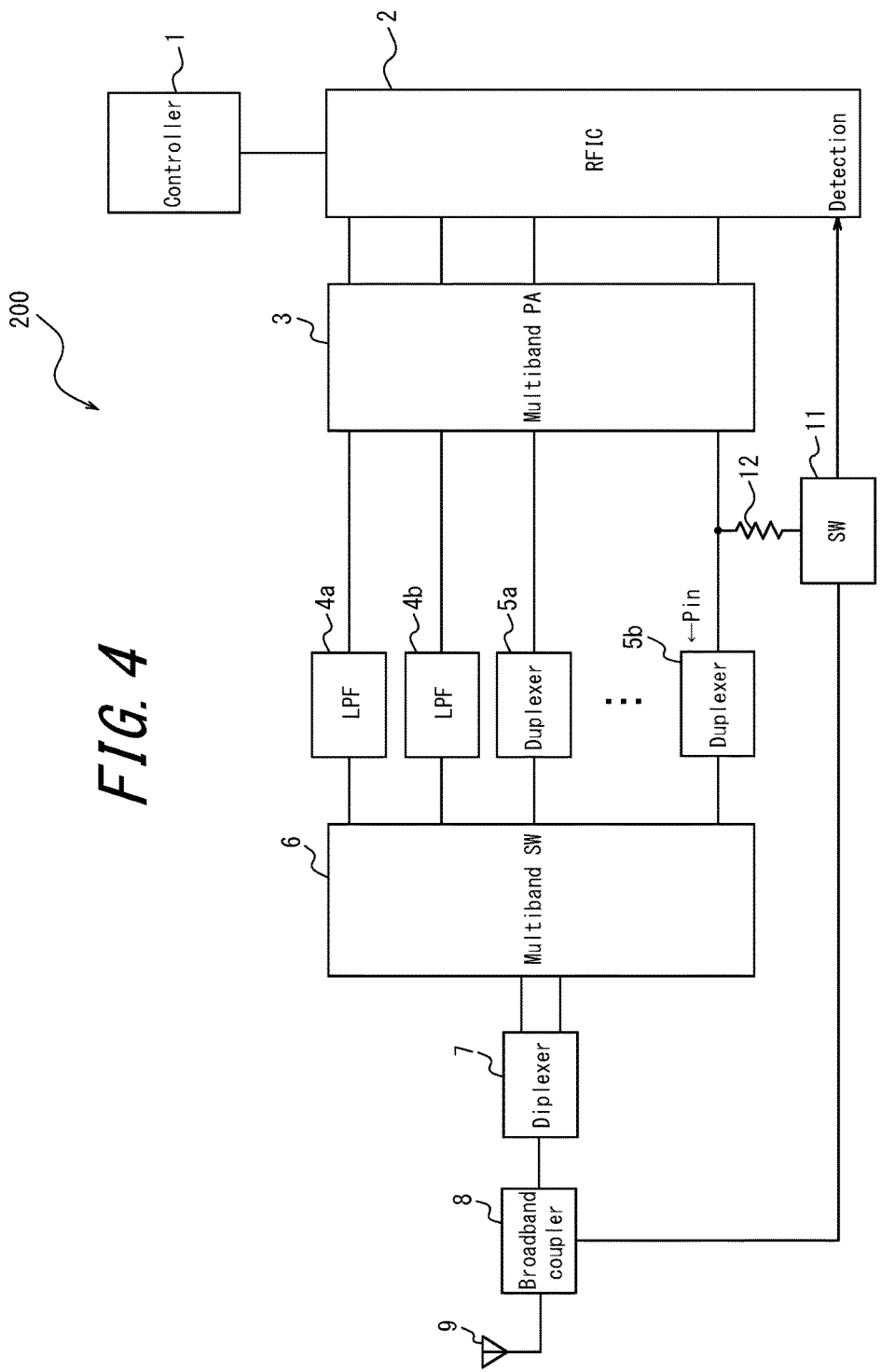
FIG. 4 is a schematic diagram illustrating a configuration of a communication device according to a second embodiment of this disclosure.

FIG. 4 is a schematic diagram illustrating a configuration of a communication device 200 according to the second embodiment of this disclosure. As illustrated in FIG. 4, the communication device 200 has, instead of the coupler 10, a branch point between the multiband PA 3 and the duplexer 5b, and a resistance 12 between the branch point and the switch 11. Other than that, the configuration is the same as that of the communication device 100 according to the first embodiment, and thus the description is omitted.

When the switch 11 is connected to the resistance 12 side, a portion of the transmitting signal input from the multiband PA 3 is input to RFIC 2 through the resistance 12 as a detection signal, and Pin decreases. For example, when the resistance 12 of 100Ω is used, Pin decreases by about 1.2 dB.

Figure 5:
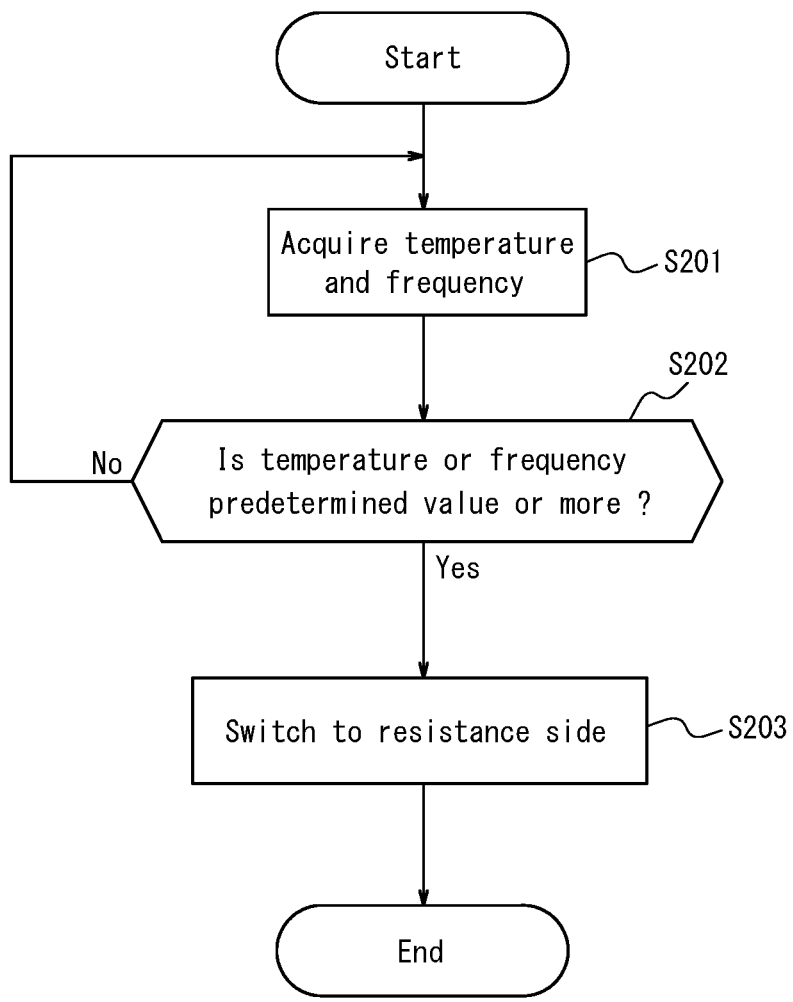
FIG. 5 is a flow chart illustrating an operation example of the communication device according to the second embodiment of this disclosure.

FIG. 5 is a flow chart illustrating an operation example of the communication device 200 according to this embodiment. This operation example is executed while the communication device 200 outputs transmitting signals. During a normal operation, the switch 11 is connected to the first state, that is, the broadband coupler 8. The steps S201 and S202 of this operation example are the same as the steps S101 and S102 of the operation example of the first embodiment, thus the explanation is omitted.

The controller 1 switches the switch 11 to the resistance 12 side (step S203) when it determines that the temperature is a predetermined value or more or the frequency is a predetermined value of more (Yes at step S202).

According to this embodiment, even if the temperature exceeds the predetermined value and the frequency exceeds the predetermined value and as a result the passing loss of the duplexer 5b increases, when the switch 11 switches to the resistance 12 side, the power Pin input to the duplexer 5b is detected, and as a result of this, the detection result is not affected by the increase in the passing loss of the duplexer 5b. Furthermore, a portion of the transmitting signal input from the multiband PA 3 is input to RFIC 2 as a detection signal, and as a result, Pin decreases. Thus, an increase in Pin can be prevented, and as a result, continuing self heat generation of the duplexer 5b can be prevented.

It should be noted that the resistance 12 of the communication device 200 according to this embodiment may be combined with the coupler 10 of the communication device 100 according to the first embodiment.

Third Embodiment

Figure 6:
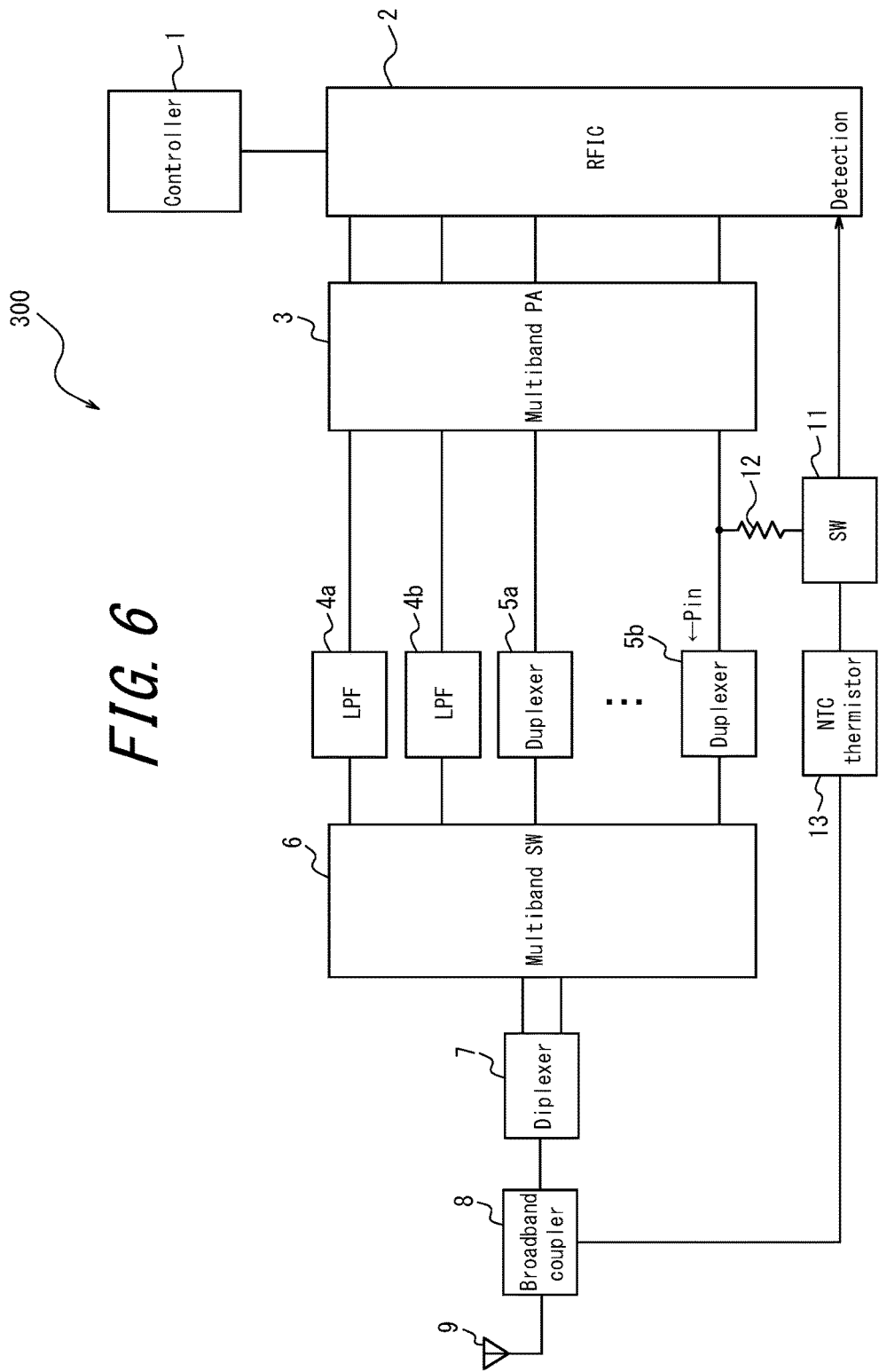
FIG. 6 is a schematic diagram illustrating a configuration of a communication device according to a third embodiment of this disclosure.

FIG. 6 is a schematic diagram illustrating a configuration of a communication device 300 according to the third embodiment of this disclosure. As illustrated in FIG. 6, the communication device 300 includes a NTC (Negative Temperature Coefficient) thermistor between the broadband coupler 8 and the switch 11. Other than that the configuration is the same as that of the communication device 200 according to the second embodiment, thus the explanation is omitted.

The NTC thermistor 13 is a resistance whose resistance decreases as the temperature rises. When the switch 11 is in the first state, the resistance of the NTC thermistor 13 decreases as the temperature rises, and as a result, a dummy power on the position of the broadband coupler 8 detected as a transmitting signal is detected larger than really it is, and as a result, even if the temperature rises, the controller 1 can suppress an increase in the output power of the transmitting signal. It should be noted that, in order to exhibit this function effectively, the NTC thermistor 13 may be disposed in the vicinity of the duplexer 5b.

Thus, according to this embodiment, even if the temperature exceeds the predetermined value and the frequency exceeds the predetermined value and as a result the passing loss of the duplexer 5b increases, when the switch 11 switches to the resistance 12 side, the power Pin input to the duplexer 5b is detected, and as a result, the detection result is not affected by the increase in the passing loss of the duplexer 5b. Furthermore, a portion of the transmitting signal input from the multiband PA 3 is input to RFIC 2 as a detection signal, and as a result, Pin decreases. Moreover, an increase in Pin with increasing temperature can be suppressed by the NTC thermistor 13 even before the switch 11 switches to the resistance 12 side. Thus, an increase in Pin can be prevented, and as a result, continuing self heat generation of the duplexer 5b can be prevented.

It should be noted that the NTC thermistor 13 of the communication device 300 according to this embodiment may be provided between the broadband coupler 8 and the switch 11 of the communication device 100 according to the first embodiment.

Fourth Embodiment

Figure 7:
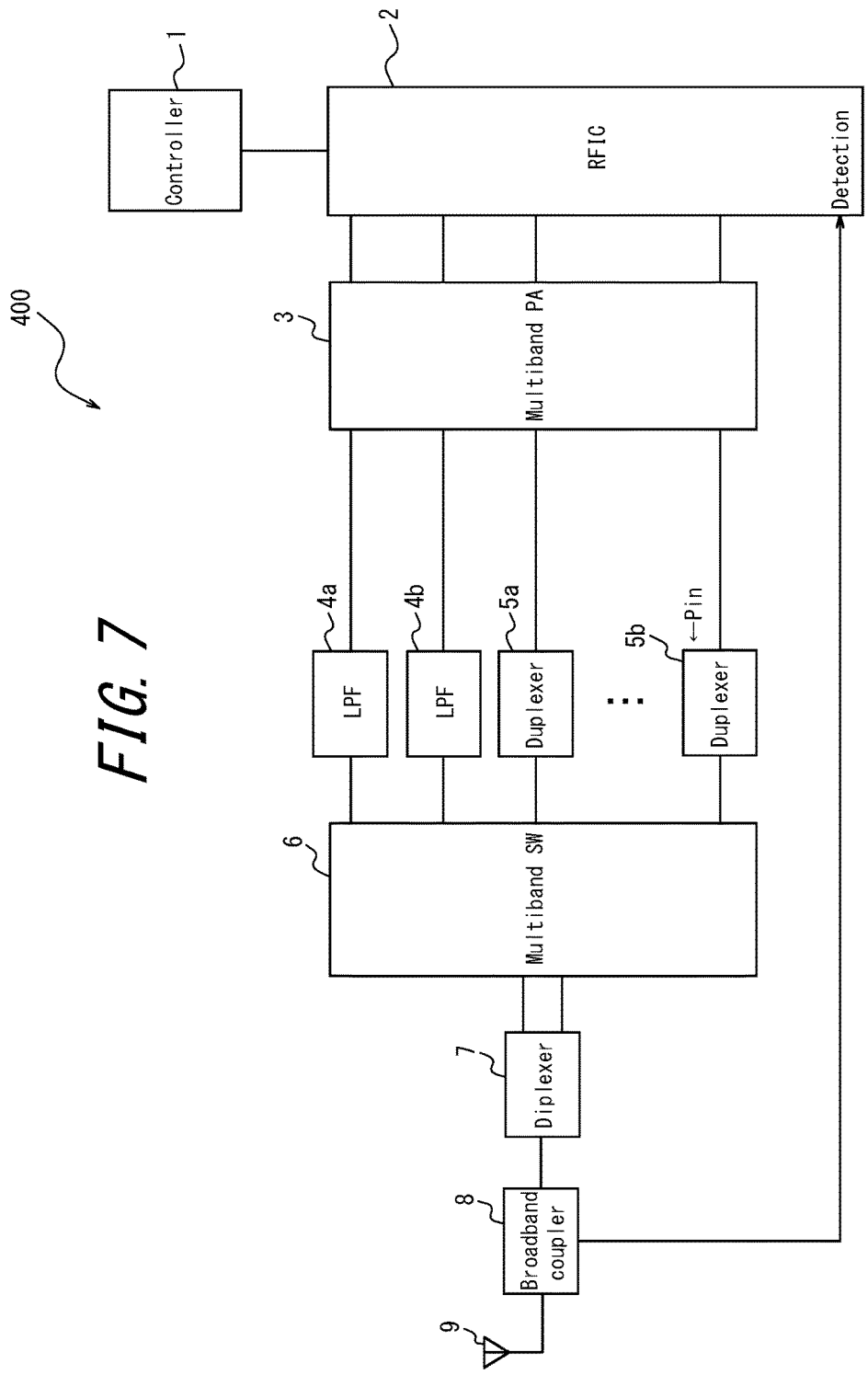
FIG. 7 is a schematic diagram illustrating a configuration of a communication device according to a fourth embodiment of this disclosure.

FIG. 7 is a schematic diagram illustrating a configuration of a communication device 400 according to the fourth embodiment of this disclosure. As illustrated in FIG. 7, the communication device 400 does not include the coupler 10 and the switch 11. Other than that the configuration is the same as that of the communication device 100 according to the first embodiment, thus the explanation is omitted. In the communication device 400, a transmitting signal on the position of the broadband coupler 8 is detected.

FIG. 8 is a flow chart illustrating an operation example of the communication device according to this embodiment. This operation example is executed while the communication device 400 outputs transmitting signals. The steps S301 and S302 of this operation example are the same as the steps S101 and S102 of the operation example of the first embodiment, thus the explanation is omitted.

When the controller 1 determines that the temperature is the predetermined value or more or the frequency is the predetermined value or more (Yes at step S302), it decreases the power amplification of the transmitting signal by the multiband PA 3 (step S303). Concerning the amount of decrease in the power amplification, when the defined value of output power is 23 dBm, for example, it is decreased by about 1 dBm, and the resulting value is about 22 dBm.

As described above, according to this embodiment, even if the temperature exceeds the predetermined value and the frequency exceeds the predetermined value and as a result the passing loss of the duplexer 5b increases, the controller 1 decreases the power amplification of the transmitting signal by the multiband PA 3, and as a result, Pin decreases. Therefore, an increase in Pin can be prevented, and as a result, continuing self heat generation of the duplexer 5b can be prevented.

It should be noted that control of decrease in the power amplification by the controller 1 of the communication device 400 according to this embodiment may be combined with each communication device 100, 200 and 300 according to the first through third embodiments.

According to the communication device of this disclosure, continuing self heat generation of a duplexer can be prevented.

Although this disclosure has been described with reference to the accompanying drawings and embodiments, it is to be noted that various changes and modifications will be apparent to those skilled in the art based on this disclosure. Therefore, such changes and modifications are to be understood as included within the scope of this disclosure. For example, the functions and the like included in the members, units, steps, and the like may be reordered in any logically consistent way. Furthermore, units, steps, and the like may be combined into one or divided. Furthermore, it may be any combination of any of the first embodiment and the second embodiment and the third embodiment and the fourth embodiment.

The invention claimed is:

1. A communication device, comprising:
   a signal generator configured to generate a transmitting signal that uses a plurality of frequency bands;
   an amplifier configured to amplify and output the transmitting signal generated by the signal generator;
   a plurality of duplexers configured to separate and output a receiving signal and the transmitting signal output by the amplifier;
   a first detection means configured to detect the transmitting signal output from the duplexer;
   a controller configured to control power amplification of the transmitting signal by the amplifier based on detection by the first detection means; and
   a second detection means configured to detect the transmitting signal input to the duplexer from the amplifier;
   wherein the controller controls the power amplification of the transmitting signal by the amplifier based on detection by the second detection means when a temperature is a predetermined value or more or a frequency of the transmitting signal is a predetermined value or more.

2. The communication device according to claim 1, wherein the second detection means further comprises a resistance.

3. The communication device according to claim 1, wherein the first detection means further comprises a NTC thermistor.

4. The communication device according to claim 1, wherein the second detection means detects a transmitting signal input to a duplexer that is compatible with LTE.

5. A communication device, comprising:
   a signal generator configured to generate a transmitting signal that uses a plurality of frequency bands;
   an amplifier configured to amplify and output the transmitting signal generated by the signal generator;
   a plurality of duplexers configured to separate and output a receiving signal and the transmitting signal output by the amplifier;
   a first detection means configured to detect the transmitting signal output by the duplexer; and
   a controller configured to control power amplification of the transmitting signal by the amplifier based on the detection by the first detection means, and decrease the power amplification of the transmitting signal by the amplifier when a temperature is a predetermined value or more or a frequency of the transmitting signal is a predetermined value or more.

* * * * *